(12) United States Patent
Chen et al.

(10) Patent No.: US 7,797,658 B2
(45) Date of Patent: Sep. 14, 2010

(54) MULTITHREADED STATIC TIMING ANALYSIS

(75) Inventors: George J. Chen, Union City, CA (US); Darryl J. Gove, Sunnyvale, CA (US); Robert E. Mains, Morgan Hill, CA (US)

(73) Assignee: Oracle America, Inc., Redwood City, CA (US)

( * ) Notice: Subject to any disclaimer, the term of this patent is extended or adjusted under 35 U.S.C. 154(b) by 310 days.

(21) Appl. No.: 11/876,688

(22) Filed: Oct. 22, 2007

(65) Prior Publication Data

US 2009/0106717 A1 Apr. 23, 2009

(51) Int. Cl.
G06F 17/50 (2006.01)
G06F 9/45 (2006.01)

(52) U.S. Cl. .............................................. 716/6; 716/4
(58) Field of Classification Search ...................... 716/4, 716/6
See application file for complete search history.

(56) References Cited

U.S. PATENT DOCUMENTS

| | | | |
|---|---|---|---|
| 7,181,383 B1 * | 2/2007 | McGaughy et al. ........... 703/14 |
| 7,363,599 B1 * | 4/2008 | Vogenthaler .................... 716/2 |
| 2004/0255257 A1 * | 12/2004 | Ratzlaff .......................... 716/6 |
| 2008/0115100 A1 * | 5/2008 | Vinitzky et al. ............... 716/13 |
| 2008/0162904 A1 * | 7/2008 | Kalla et al. .................. 712/234 |
| 2008/0301655 A1 * | 12/2008 | Gulwani et al. ............. 717/156 |

* cited by examiner

Primary Examiner—Thuan Do
Assistant Examiner—Magid Y Dimyan
(74) Attorney, Agent, or Firm—Martine Penilla & Gencarella, LLP

(57) ABSTRACT

A method and apparatus for executing multithreaded algorithm to provide static timing analysis of a chip design includes analyzing a chip design to identify various components and nodes associated with the components. A node tree is built with a plurality of nodes. The node tree identifies groups of nodes that are available in different levels. A size of node grouping for a current level is determined by looking up the node tree. Testing data for parallel processing of different size of node groupings using varied thread counts is compiled. An optimum thread count for the current level based on the size of node grouping in the node tree is identified from compiled testing data. Dynamic parallel processing of nodes in the current level is performed using the number of threads identified by the optimum thread count. An acceptable design of the chip is determined by the dynamic parallel processing.

14 Claims, 12 Drawing Sheets

| Number of Threads | 200 | 2,000 | 10,000 | 50,000 | 200,000 |
|---|---|---|---|---|---|
| 1 | X | | | | |
| 2 | | X | | | |
| 4 | | | X | | |
| 8 | | | | X | |
| 16 | | | | | X |

Figure 11

MULTITHREADED STATIC TIMING ANALYSIS

FIELD OF THE INVENTION

The present invention relates generally to tools used in analyzing digital circuits and, more particularly, to a static timing analysis tool for analyzing a digital circuit.

BACKGROUND

Description of the Related Art

High performance integrated circuits are extremely complex and contain an enormous amount of components (cells). As the complexity of the digital circuits' increase with the decreasing size of the components and increasing number of components packed into the digital circuit, analyzing the integrated circuits for acceptable design during design phase becomes tedious and time consuming. One way of analyzing the integrated circuit design is by way of measuring circuit timing to ensure that the chip performs satisfactorily within certain time limits. One common tool for obtaining timing measurements for measuring circuit timing of the digital circuit is by way of a circuit simulation. However, due to the complexity of digital circuits, the circuit simulation takes too long, rendering the tool impractical.

Another process used to obtain timing measurements is referred to as static timing analysis (STA). STA is a technique for analyzing a circuit's timing behavior by computing the expected timing of a digital circuit without requiring simulation. Conventional STA uses simplified delay models to obtain reasonably accurate measurement of circuit timing. The conventional STA method commonly engages a path oriented approach for calculating circuit timing. The path oriented approach identifies various nodes and traces each path through a logic network of nodes and computes arrival times at each node separately for each path. As the number of paths in the logic network increase exponentially with the number of nodes in the network, the amount of time it takes to complete circuit timing analysis becomes longer. Thus, although the conventional STA approach is advantageous over other approaches due to speed and convenience, conventional STA can still be fairly complicated resulting in delays in the analysis of the circuit design.

Therefore, it will be advantageous to have a simple STA tool that provides accurate analysis results in considerably less time.

SUMMARY

Several distinct embodiments are presented herein as examples, including methods, and apparatus for executing a multithreaded algorithm that performs a static timing analysis of an integrated circuit (chip). The multithreaded algorithm includes logic for traversing the chip to identify a plurality of components (cells or nodes) within a chip circuit of the chip. A waveform graph is defined using the identified nodes. Levels are assigned to groups of nodes from the waveform graph. A plurality of threads is used in processing all of the nodes in one level prior to processing the nodes in the next level. The chip design is determined acceptable based on analysis of data obtained from the processed nodes and through timing checks using the analyzed data. The timing check compares arrival time at a data pin with that of a clock pin to determine if the design passes. If the chip design passes the timing check, then the design of the chip is acceptable.

In one embodiment, a method for executing a multithreaded algorithm to perform a static timing analysis of a chip is disclosed. The method includes traversing a chip circuit of the chip to identify a plurality of nodes within the chip. A waveform graph is defined using the identified nodes. Groups of one or more nodes from the plurality of nodes are assigned a level. All the nodes from one level are processed before proceeding to process the nodes in a next level. Two or more threads are used to process the nodes of each level in parallel. A timing check is performed for the chip to determine if the design of the chip is acceptable.

In another embodiment, an apparatus for executing a multithreaded algorithm to perform a static timing analysis of a chip is disclosed. The apparatus includes a chip multithreading processor and a multithreading algorithm engine. The multithreading algorithm engine includes a multithreaded algorithm to analyze the chip in order to identify a plurality of nodes within a chip circuitry of the chip, to define a waveform graph from the identified plurality of nodes, to assign a level for groups of nodes from the identified plurality of nodes, to process all of the nodes in one level using one or more threads before proceeding to process all the nodes in a next level and to perform a timing check to determine an acceptable design of the chip. In each level, two or more nodes are processed in parallel with two or more threads.

In yet another embodiment, a method for executing a multithreaded algorithm to perform a static timing analysis of a chip is disclosed. The method includes building a node tree with a plurality of nodes. The plurality of nodes that make up the node tree is obtained through a static analysis of the chip design. The node tree identifies groups of nodes that are available in different levels. The size of node grouping for a current level is determined by looking up a particular level in the node tree. Testing data for parallel processing of different size of node groupings using varied thread counts is compiled. An optimum thread count for the current level based on the size of node grouping in the node tree is identified from testing data. Dynamic parallel processing of nodes in the current level is performed using the number of threads identified by the optimum thread count. The dynamic parallel processing determines an acceptable design of the chip.

The present invention, thus, describes method and apparatuses for effectively executing a multithreaded algorithm to perform a static timing analysis of a chip. The embodiments of the invention include identifying the nodes (cells or components) in a chip circuit by traversing the chip and building a node tree. Various levels are identified for the nodes in the node tree. Dynamic parallel processing of nodes using multithreads is performed within a given level prior to processing the nodes in a subsequent level. Testing data compiled for parallel processing of different size of node groupings using varied thread counts are used to obtain an optimum number of threads for parallel processing of the nodes in each level. Using this multithreaded algorithm, the analysis of the chip design can be performed in substantially less time.

BRIEF DESCRIPTION OF THE DRAWINGS

The invention may best be understood by reference to the following description taken in conjunction with the accompanying drawings. These drawings should not be taken to limit the invention to the preferred embodiments, but are for explanation and understanding only.

FIG. 11 illustrates a sample testing data obtained using multithreaded processing, in one embodiment of the invention.

DETAILED DESCRIPTION

The present invention provides a multithreaded algorithm to effectively perform a static timing analysis of a chip circuit. A conventional static timing analysis method engages a path oriented approach for calculating circuit timing. The path oriented approach identifies various nodes and traces each path through a logic network of nodes and computes arrival times at each node separately for each path. As the number of paths grows exponentially with the number of nodes in the circuit, the amount of time taken by the static timing analysis to process all the nodes in all the paths is considerable.

To address the delay in analyzing a chip circuit, a multithreaded algorithm is defined. The multithreaded algorithm assigns levels to groups of nodes within a chip circuit and the nodes in the level are processed in parallel using an optimum number of threads. The parallel processing of the nodes at each level mitigates the timing delay experienced during the analysis of the chip thereby resulting in a faster analysis of the chip. The multithreaded algorithm is designed to traverse a chip design of a chip to identify a plurality of components and a plurality of nodes and edges (interconnections) associated with the components. A waveform graph is generated from the nodes and edges connecting the nodes. The nodes in the waveform graph are traversed and levels are assigned to groups of nodes in the waveform graph such that the level assigned to a current node is greater than a level assigned to all predecessor nodes associated with the current node. The multithreaded algorithm further includes logic to dynamically assign a number of threads so that the multithreads can parallel process all the nodes in a given level prior to processing all of the nodes in a subsequent level. A timing check is performed after all the nodes within the chip circuit are processed wherein the timing check will determine the acceptability of a particular design of the chip. By providing parallel processing of the nodes in each level, the delay associated with the processing of the nodes are substantially reduced resulting in faster analysis of the chip circuit.

To facilitate an understanding of the various embodiments, a simplified sample chip circuit of a chip will be described first. The features of the disclosed embodiments will then be described with reference to the sample chip circuit. The present invention is not restricted to the simplified chip circuit but can be extended to any type of complex chip circuit. With this understanding in mind, it should be appreciated that the present invention can be implemented in different ways such as apparatuses and methods. It will be apparent to those skilled in the art that the present invention may be practiced without some or all of the specific details set forth herein.

Figure 1:
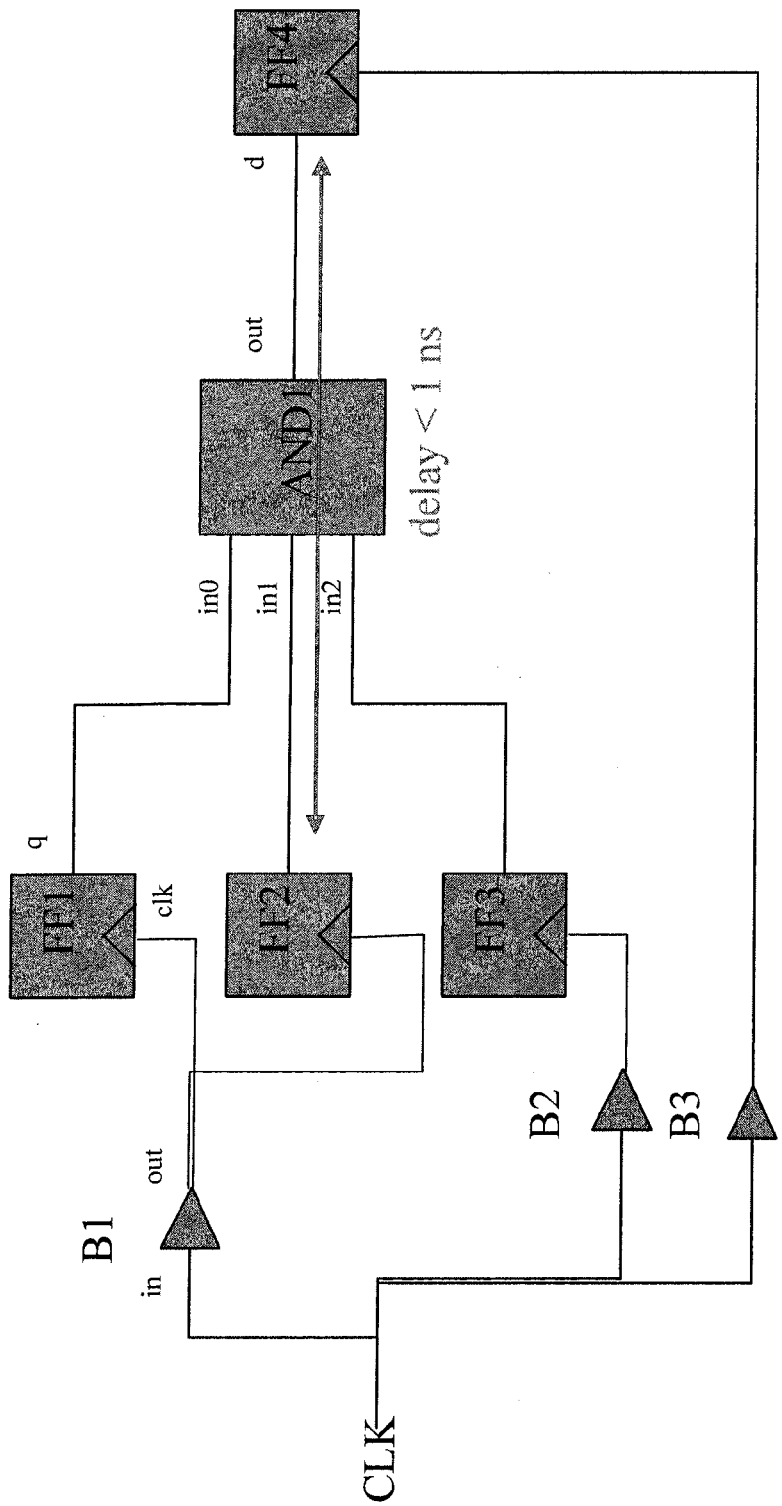
FIG. 1 illustrates a simplified sample design of a chip circuit, in one embodiment of the invention.

FIG. 1 illustrates a sample simplified design circuitry of a chip. The design includes a plurality of logic components and their interconnections that make up the chip or section of a chip. The logic components in the design circuitry of the chip include three buffers, B1, B2, B3, an AND gate, AND1, and four flip flops, FF1, FF2, FF3 and FF4, respectively. In reality, a design circuit of a chip can contain anywhere from one to millions of logic components such as logic gates, buffers, inverters, flip-flops, multiplexors, etc. A clock signal, CLK, provides clock timing for a signal to pass through the various logic components of the design circuitry.

The multithreaded algorithm traverses the chip design and generates a waveform graph representing various nodes and edges that make up the chip design. As mentioned earlier, a generic chip circuit includes a multitude of the components represented in FIG. 1 and the multithreaded algorithm identifies each of the components and establishes nodes associated with each of the components in the waveform graph. It is noteworthy that the present invention is not limited to the architecture of FIG. 1. Typically, the chip circuit design is more complex than the one illustrated in FIG. 1 with each chip design including a multitude of various components including the ones illustrated in FIG. 1. Thus, the embodiment illustrated in FIG. 1 must be considered exemplary and not representative of a chip design of a chip.

Figure 2:
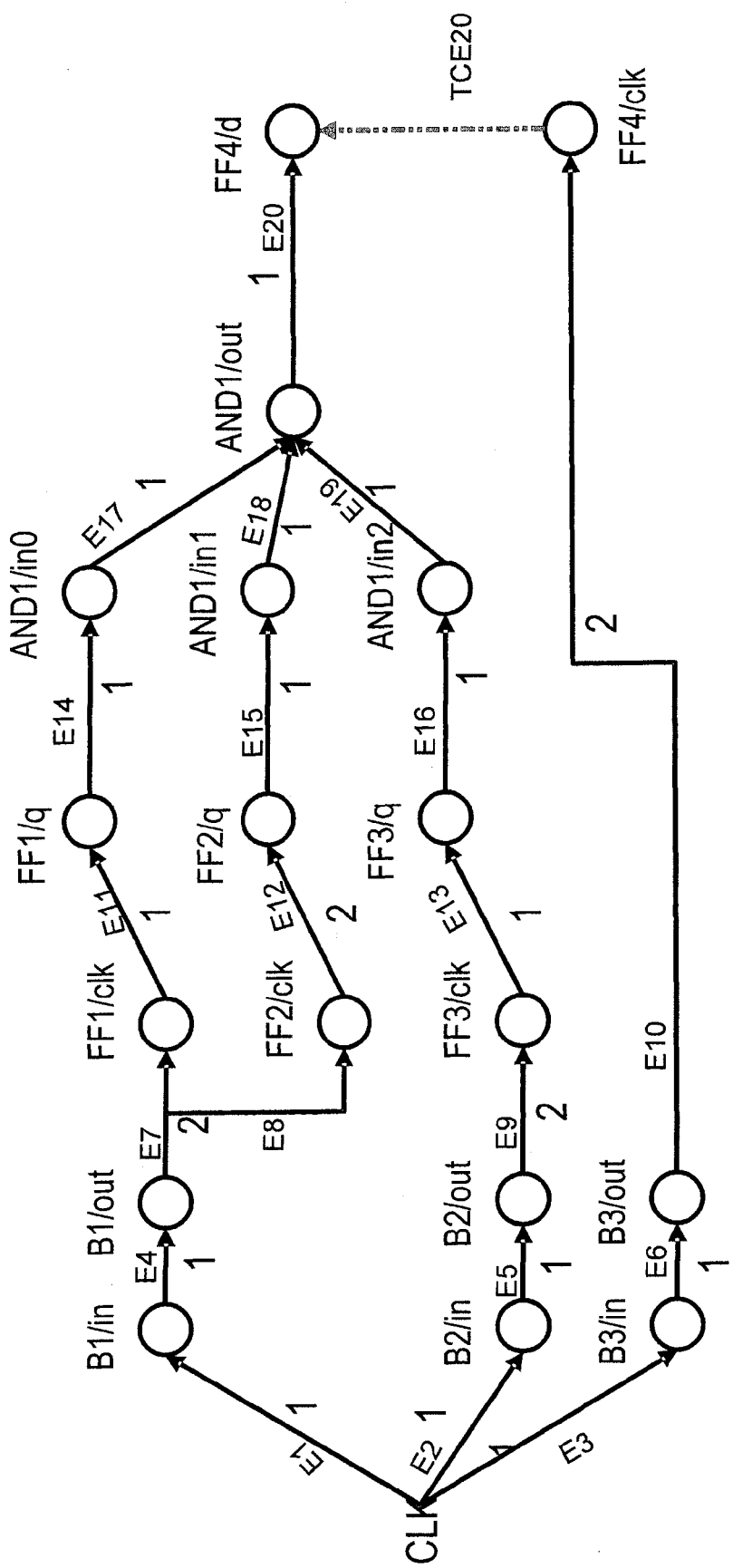
FIG. 2 illustrates a sample waveform graph derived for the sample design of a chip circuit illustrated in FIG. 1, in one embodiment of the invention.

FIG. 2 illustrates a sample waveform graph of the chip design circuit identified in FIG. 1. As can be seen, the components represented in FIG. 1 are associated with a plurality of nodes and edges. The nodes represent an instance of a logic element or a collection of logic elements having an associated logic function. Each node, therefore, may represent either an input pin or an output pin of each component in the chip design. For instance, component buffer 1 of FIG. 1 is represented by two nodes, B1/in and B1/out representing the input and output pins to buffer 1, respectively. The edges represent connectivity between the nodes. As illustrated in FIG. 2, edges E1-E20 represent propagation edges that connect respective nodes of components. Edge TCE20 represents a special edge over which a timing check is performed between end nodes FF4/d and FF4/clk. The timing check will determine whether the particular chip design, being analyzed using the multithreaded algorithm, meets a timing criterion.

The multithreaded algorithm may obtain the list of components by analyzing an actual chip design or from a plurality of files and generate a corresponding waveform graph. In cases where the list of components is obtained from a plurality of files, design model information maybe obtained from a design model file. Similarly, list of components and connectivity information, such as gates and connectivity between gates, may be obtained from a structural or design netlist and parasitic information, such as Resistor-Capacitor connection information may be obtained from a separate parasitic information file or from the structural/design netlist. Along the same lines, technology information may be obtained from a technology information file and timing delay, such as delay from one point to another point that may or may not be specific to a particular component, may be obtained from timing model file. External constraints that control what data to read, clock frequency for the particular chip design, etc., may be obtained from a tool command language (tcl command) file. The external constraints and input data are all obtained prior to the processing of nodes.

Referring back to FIG. 2, the multithreaded algorithm computes the timing delay at each edge by using the input from the timing model file and the clock frequency associated with a particular chip design. The edge delay associated with each edge E1-E20 is derived as shown in FIG. 2.

Figure 3:
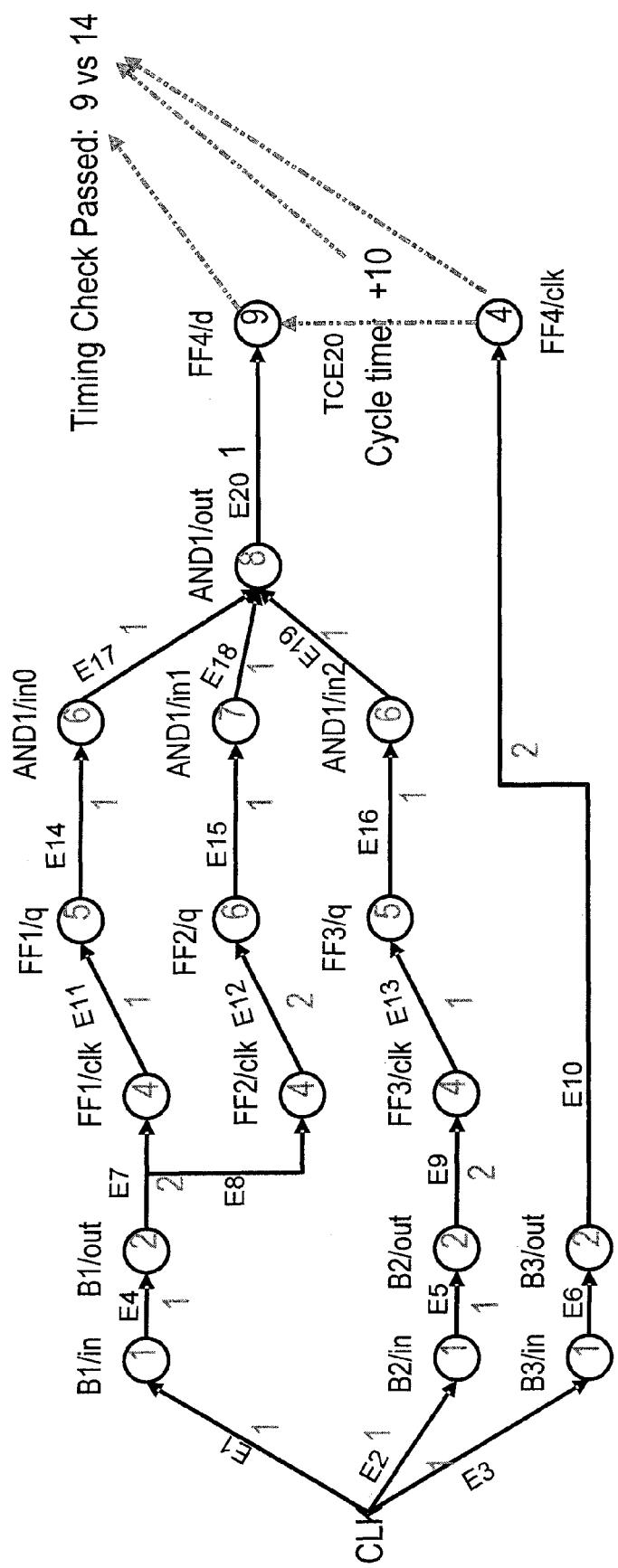
FIG. 3 illustrates computed arrival time and timing check for the sample waveform graph of a chip circuit illustrated in FIG. 2, in one embodiment of the invention.

One of the approaches in a conventional static timing analysis algorithm uses a Depth-First-Search algorithm to process each node of the waveform graph. The processing of nodes may include identifying a branch, identifying nodes on the branch, and computing arrival time at each node on the branch. FIG. 3 illustrates the result of one such computation, in one embodiment of the invention. The arrival times are calculated for all nodes of a particular branch one at a time before proceeding to the next branch. The arrival time at a current node is a sum of the arrival time at a preceding node associated with the current node and the edge delay of the incoming edge associated with the current node. When the current node is the first node in the branch, the arrival time at the current node is equal to the edge delay of the incoming edge from a launching clock signal. Since the clock signal launches the signal (both data and clock) along the components of the chip, the corresponding launch time (arrival time) at the launch node is considered while computing the arrival time for the current node. Typically, the launch time is a user-specified time. When the current node includes more than one incoming edge, then the worse case arrival time of all incoming edges is used in computing the arrival time at the current node to accommodate delays encountered at any of the incoming edges. For instance, in a "max process corner" static timing analysis, the worse case arrival time is the maximum of the computed arrival time of all incoming edges. Other checks in static timing analysis may also be considered in arriving at the appropriate arrival time at the current node. Thus, in FIG. 3, the arrival time for node AND1/out with three incoming edges, E17, E18, E19, is computed using the latest arrival time of 7 from the incoming edge E18 and the corresponding line delay of 1 for a computed arrival time of 8. For edges that feed into more than one node, the edge delay is adjusted to accommodate the delay in transmission of signal to both nodes. Thus, node FF1/clk and FF2/clk, the edge delay along edges E7 and E8 are adjusted accordingly to accommodate any delay in the arrival of the signals at the respective nodes.

Once all the nodes in all the branches are computed, a timing check is performed along a timing check edge to determine if the circuit design passes the timing check or not. The timing check is performed by comparing the arrival time at the data input pin (flip flop node FF4/d) with the arrival time at the clock pin (node FF4/clk) adjusted by a clock frequency, along a timing check edge TCE20. The clock frequency may be obtained as a constraint provided by either a user during the analysis or through a tcl command file. If, during the timing check, it is determined that the data arrival time is less than the clock arrival time at the respective nodes, the timing check "passes" indicating that the circuit design is acceptable. The chip design is acceptable as the data arrives at the respective node in the circuit before it is due and there is no unnecessary wait for data. If the arrival time of the data is greater than the clock arrival time, then the circuit design is not acceptable as the waiting time for data to arrive will result in undue delay in processing.

Figure 4:
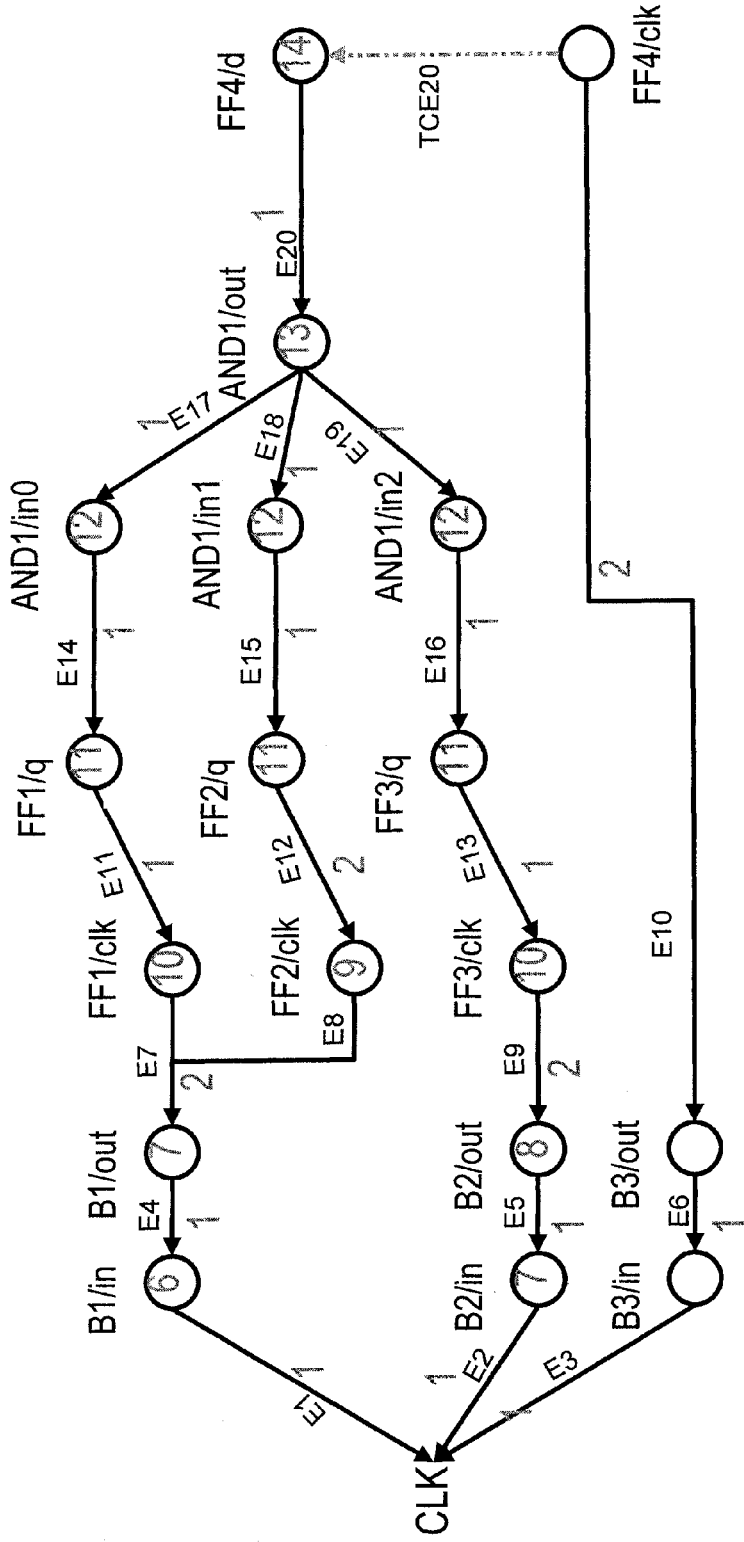
FIG. 4 illustrates computed required time for the sample waveform graph of a chip circuit illustrated in FIG. 2, in one embodiment of the invention.

To further analyze the circuit design, the conventional static timing analysis algorithm inverts the waveform graph and computes the required times at each node by traversing backwards on the waveform graph, as illustrated in FIG. 4. A required time is defined as the time a data is expected to arrive at a particular node based on a clock cycle. The required time at each node depends upon the required time of the successor node and the outgoing edge delay associated with the successor node. Thus, as shown in FIG. 4, the required time for node AND1/out (13) depends on the required time of the successor node FF4/d (14) and the outgoing edge E20 of the successor node FF4/d (1). During timing check, if the chip design fails to meet the timing criterion, the required time along with arrival time may be used to analyze the cause of the failure and identify the location of undue delay that caused the timing check to fail for the particular chip design.

Figure 5:
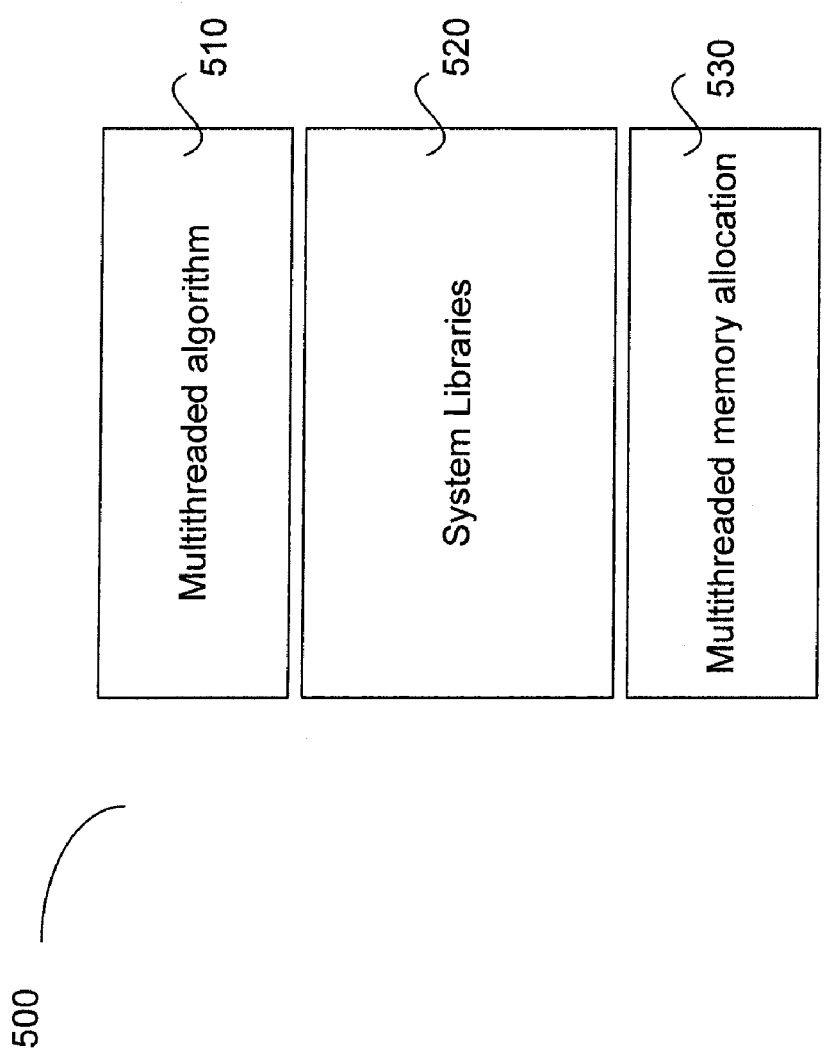
FIG. 5 illustrates a general architecture of the multithreaded algorithm, in one embodiment of the invention.

To overcome the delay in processing the nodes using a path-oriented approach of a conventional static timing analysis algorithm, a multithreaded algorithm is defined. A general architecture of a processor 500 with an embedded multithreaded algorithm is illustrated in FIG. 5. The multithreaded algorithm 510 includes logic that allows parallel processing of various nodes and edges associated with a plurality of components identified in a chip design. The multithreaded algorithm 510 is located within the processor 500 and is configured to interact with various system resources such as system libraries 520 and memory allocation modules 530 available to the processor 500. In order for the multithreaded algorithm to perform parallel processing of the nodes within the chip circuit and to obtain maximum runtime benefit, the system resources, such as system libraries and multithreaded memory allocation, are configured to perform multithreading operations.

Figure 6A:
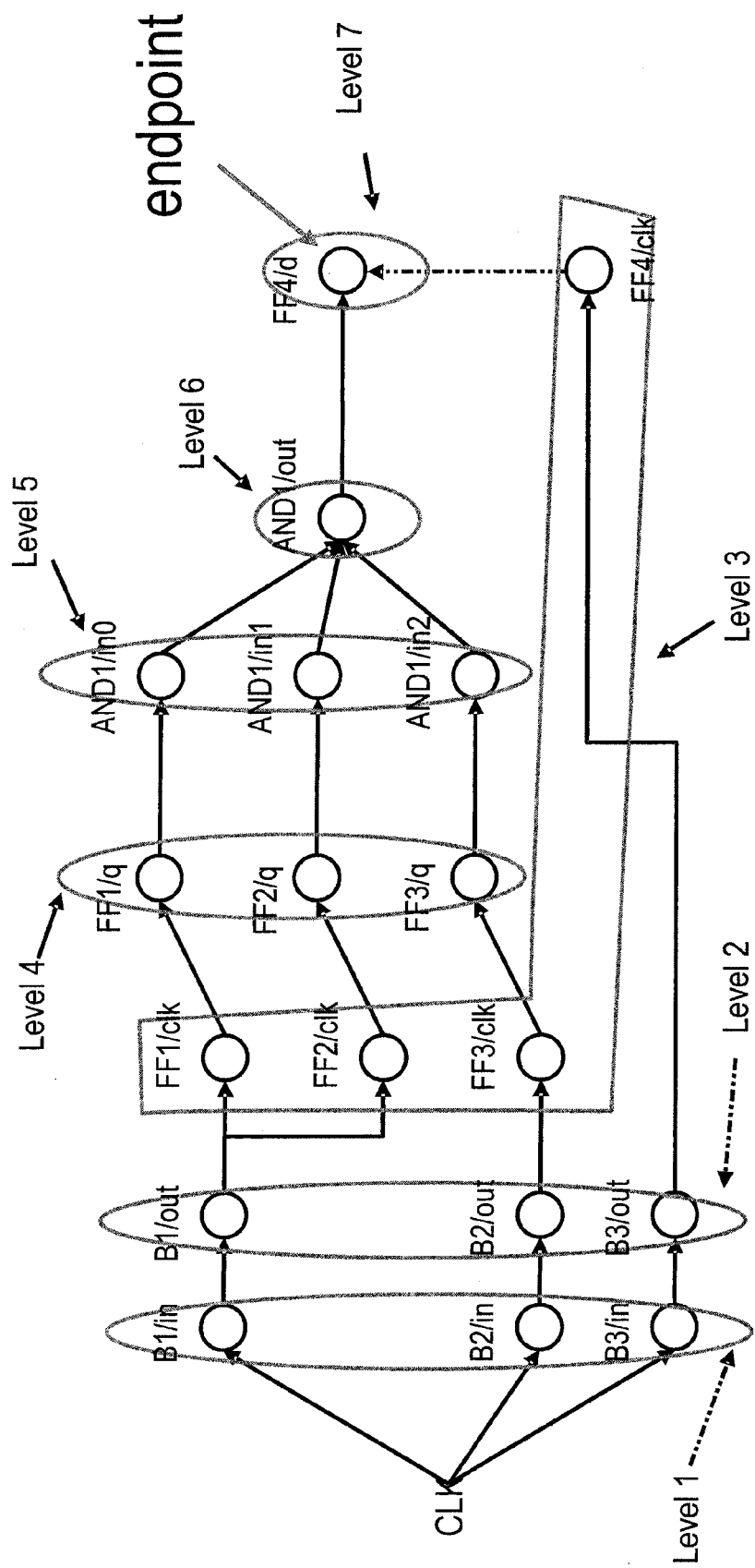
FIGS. 6A and 6B illustrate leveling of nodes based on the waveform graph illustrated in FIG. 2, in one embodiment of the invention.
Figure 6B:
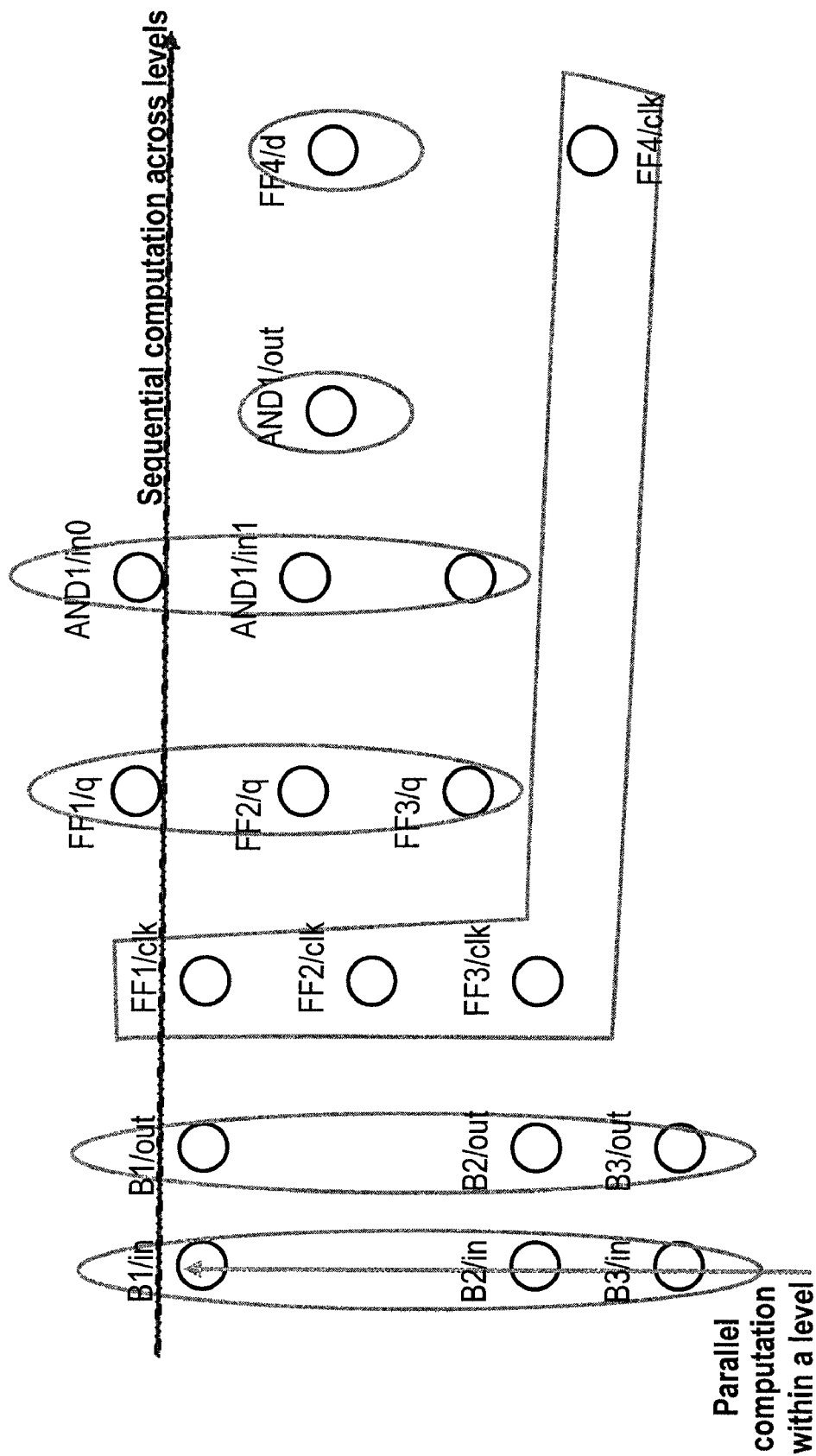

With the above general architecture of a multithreaded algorithm in mind, the function of the multithreaded algorithm will now be described with reference to FIGS. 6A and 6B. The multithreaded algorithm begins parallel processing of nodes by first traversing the design of a chip to identify the various components that make up the chip. The nodes associated with the various components and edges linking the nodes are generated in a waveform graph. The multithreaded algorithm uses information from a plurality of input files, such as netlist file, parasitic data file, design model, system libraries, etc., to arrive at the waveform graph. As mentioned earlier, the nodes could be input and output nodes (pins) associated with each component and the edges could be propagation edges between the nodes over which the signals (clock and data) are transmitted. The multithreaded algorithm then performs a topological sort of all the nodes in the waveform graph. In one embodiment, the topological sort is performed by assigning a level to each node such that the level of each node is at least 1 greater than all predecessor nodes for that node. While many such methods can be used to do the topological sort, one is described as follows. To find the level of a particular node, the predecessor node(s) are examined. If there are no predecessor nodes to the particular node, then the particular node is assigned a level of 1. If the particular node has more than one predecessor nodes, then the maximum of the levels of the predecessor nodes is determined and the level for the particular node is computed by adding one to the maximum level of the predecessor nodes. The above described routine may be implemented efficiently as a recursive subroutine. After all the nodes in the chip design have been assigned a level, each of the nodes is sorted into groups according to the levels to form a hierarchical node tree. The resulting hierarchical node tree is shown in FIG. 6A for a chip design illustrated in FIG. 1.

Accordingly, nodes B1/in, B2/in and B3/in are assigned a level of 1 as there are no preceding nodes and these nodes are grouped together under level 1, nodes B1/out, B2/out and B3/out are assigned a level of 2 based on the assigned level of 1 for the preceding group of nodes containing nodes B1/in, B2/in and B3/in and these nodes are grouped together under level 2, nodes FF1/clk, FF2/clk, FF3/clk and FF4/clk are assigned a level of 3 and grouped together under level 3, and so on.

After providing levels to all the nodes in the node tree and grouping the nodes according to assigned levels, the multithreaded algorithm then allocates appropriate number of threads to process the nodes in parallel within each level. Prior to processing nodes in a particular level, care is taken to ensure that the processing of nodes in a preceding level is complete. After parallel processing all the nodes in a given level, the multithreaded algorithm proceeds to parallel process all the nodes in the next level. The multithreaded algorithm proceeds sequentially from one level to another after completing parallel processing of all nodes within a given level, as illustrated in FIG. 6B. Thus, nodes with in a level are all processed in parallel and the levels are processed in sequence.

In one embodiment, the multithreaded algorithm assigns the number of threads for parallel processing dynamically. In order to determine the number of threads to be assigned for parallel processing, the multithreaded algorithm compiles and uses a set of testing data. The testing data is compiled by using a design model of the chip or similar type of chip or design. A sample testing data is illustrated in FIG. 11. It should be noted that the testing data illustrated in this embodiment is exemplary and the true data may be dramatically different from the one portrayed herein. The design model identifying a plurality of components is obtained from a design netlist file and the parasitic data associated with the components is obtained from parasitic information available within the design netlist file or from a separate parasitic information file. The design model is traversed and the plurality of nodes associated with the components are identified and grouped into a plurality of groups of nodes. Each group of nodes may include varied number of nodes. Each of the groups with varied number of nodes is tested repeatedly using parallel processing by engaging varied thread counts. The test result for each test is gathered in a testing data file. The test result identifies an optimum thread count for each size of node grouping that provides maximum runtime benefit during static timing analysis. Referring to FIG. 11, it can be seen that maximum benefit on runtime for a level of 2000 nodes is only 2 threads, whereas the maximum benefit on runtime for a level of 50,000 nodes is 8 threads.

Figure 7:
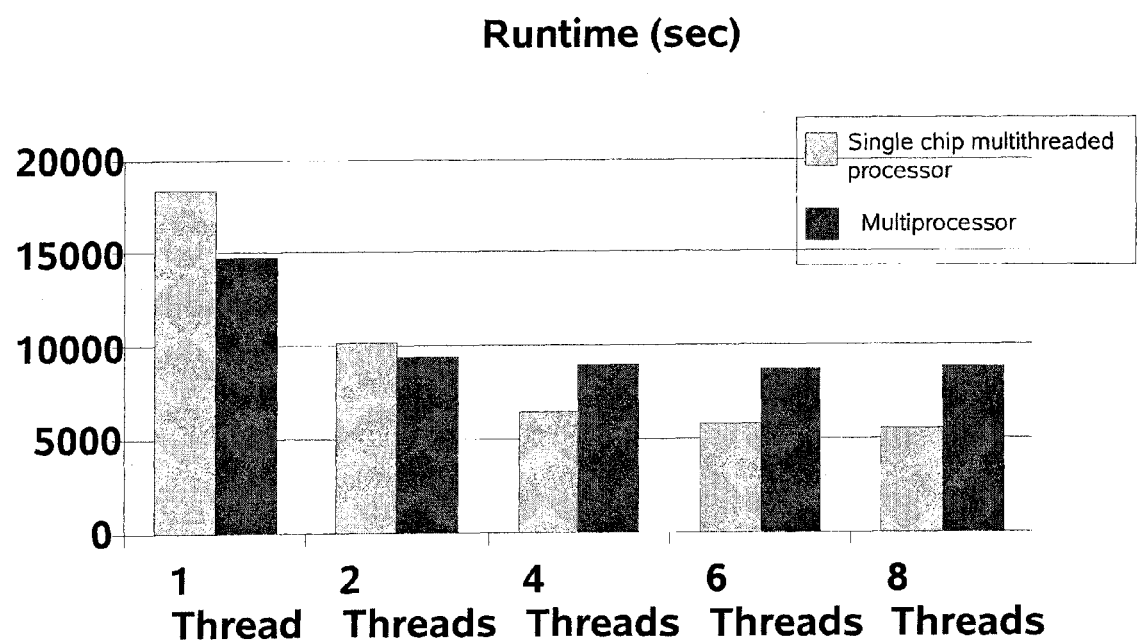
FIG. 7 illustrates the results collected from a multithreaded algorithm execution, in one embodiment of the invention.

FIG. 7 illustrates a graph of runtime associated with the static timing analysis performed using varied thread counts for different size of node groupings for a single chip processor that is capable of running multithreading operations and a multiprocessor that is capable of running multithreading operations. As can be seen from the graph, the maximum runtime benefit for a single chip multithreaded processor is when four threads are used. The runtime with greater than four threads shows only incremental benefits. Using this testing data, an optimum number of threads can be assigned to process the groupings of nodes in each level of the waveform graph based on the size of node groupings at each level.

In one embodiment, the multithreaded algorithm uses size of node groupings at an initial level to determine an optimal number of threads to be assigned for processing all of the nodes in all the levels. In this embodiment, the optimal number of threads is obtained from the testing data based on the size of node grouping at the initial level. In another embodiment, the multithreaded algorithm determines the size of the node groupings at each level prior to assigning an optimum number of threads for the particular level. In this embodiment, the number of threads for processing the nodes at each level may vary based on the size of the node groupings at that level. In both of the above embodiments, a small chunk of nodes within a particular level are identified and assigned to each of the threads. Upon successful completion of processing of the small chunks of nodes, additional small chunks are assigned to the threads. By allocating small chunks to each of the optimum number of threads, the multithreaded algorithm ensures the delay caused at any particular node will not adversely affect the overall process timing of the static timing analysis.

In yet another embodiment, the number of threads available for processing is first determined. The number of threads available may depend on a type of processor and the amount of processes currently running on the processor. The group of nodes in each level is dynamically partitioned into equal number of subgroups of nodes such that the number of subgroups equals the number of threads available for processing. Each of the subgroups of nodes is then assigned to an appropriate thread for processing. After all the nodes in all the levels have been processed, a timing check is performed to determine if the chip design meets the timing criterion. If the timing check passes the timing criterion for the chip, then the chip design is deemed acceptable. Otherwise, the chip design has to be revised.

Figure 8:
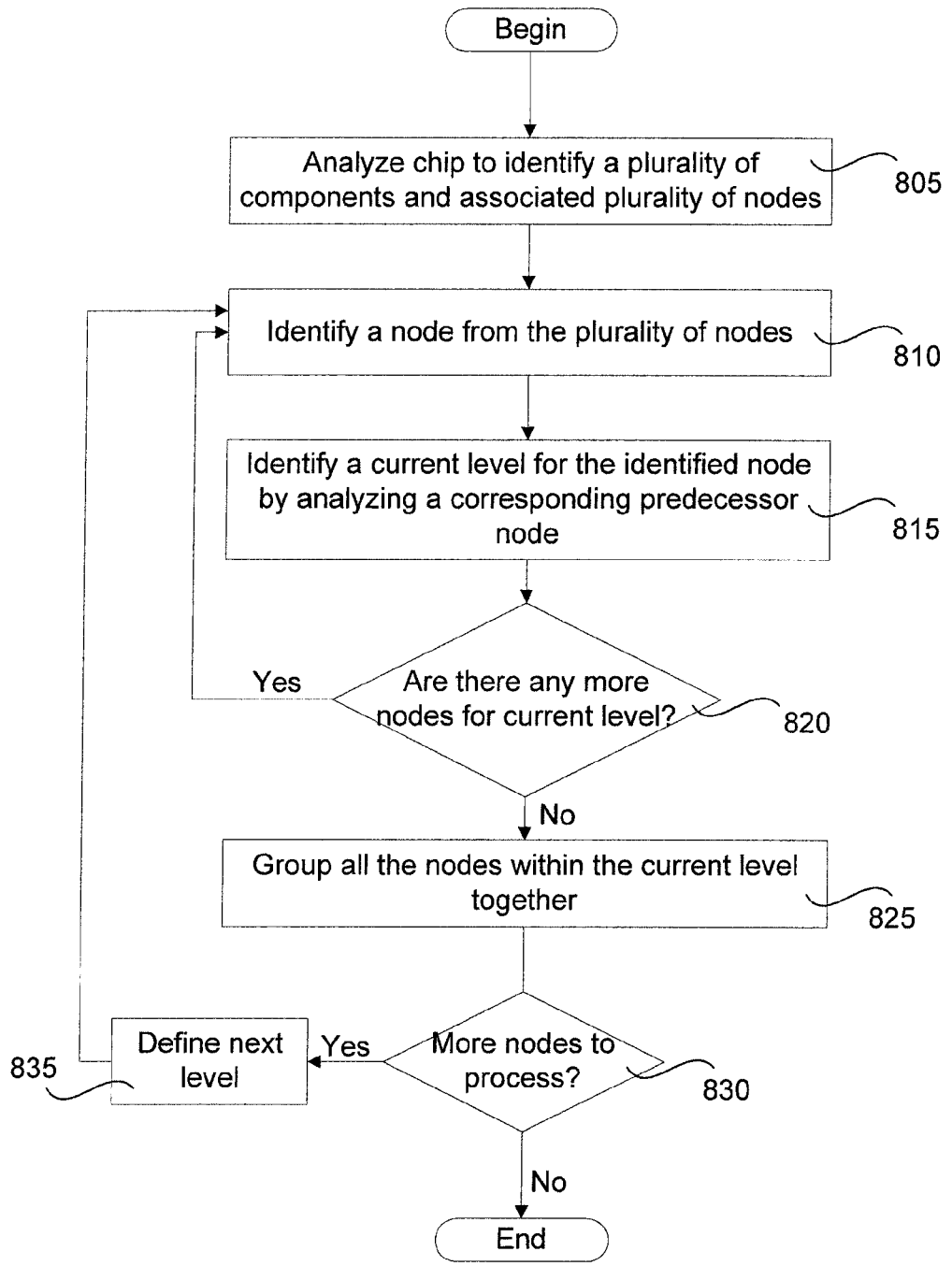
FIG. 8 illustrates a flowchart of operations involved in leveling the nodes using multithreaded algorithm of a chip circuit, in one embodiment of the invention.

FIG. 8 illustrates an overview of the process operations involved in assigning levels to a plurality of nodes, in one embodiment of the invention. As shown, the method begins with operation 805 wherein the chip design is analyzed to identify a plurality of components. Nodes associated with the plurality of components and interconnections between the nodes are defined based on the identified components. As mentioned earlier, the nodes may define an input or an output pin and the interconnections may define the propagation edges over which the signals are transmitted between nodes. The nodes are topographically sorted to create a node tree. A current node in the node tree is identified, as illustrated in operation 810, and assigned a level, as illustrated in operation 815, such that groups of nodes belonging to a particular level are assigned the same level number. The current node is assigned a current level by analyzing all the nodes that immediately precede the current node. The current level assigned to the current node is greater than the level assigned to all the predecessor nodes associated with the current node.

The node tree is then traversed to determine if there are any more nodes that need to be assigned to the current level, as illustrated in the decision operation 820. By traversing the topological sorted node tree one can ascertain that all nodes for the particular level have been properly identified and appropriately assigned. If there are additional nodes in the node tree for the particular level based on the topological sort, the process routes back to operation 810 and the process continues till there are no more nodes that need to be assigned for the particular level. Upon completion of all node assignments for the particular level, the nodes in the particular level are grouped together to form a node grouping, as illustrated in operation 825. After grouping the nodes in the particular level, the node tree is traversed to see if there are additional nodes that need to be assigned levels, as illustrated in decision operation 830. If additional nodes are found that need a level assignment, the process continues to operation 830 where a next level is defined. The process then returns to operation 810 for processing the additional nodes. The process ends when all the nodes in the node tree have been assigned appropriate levels.

Figure 9:
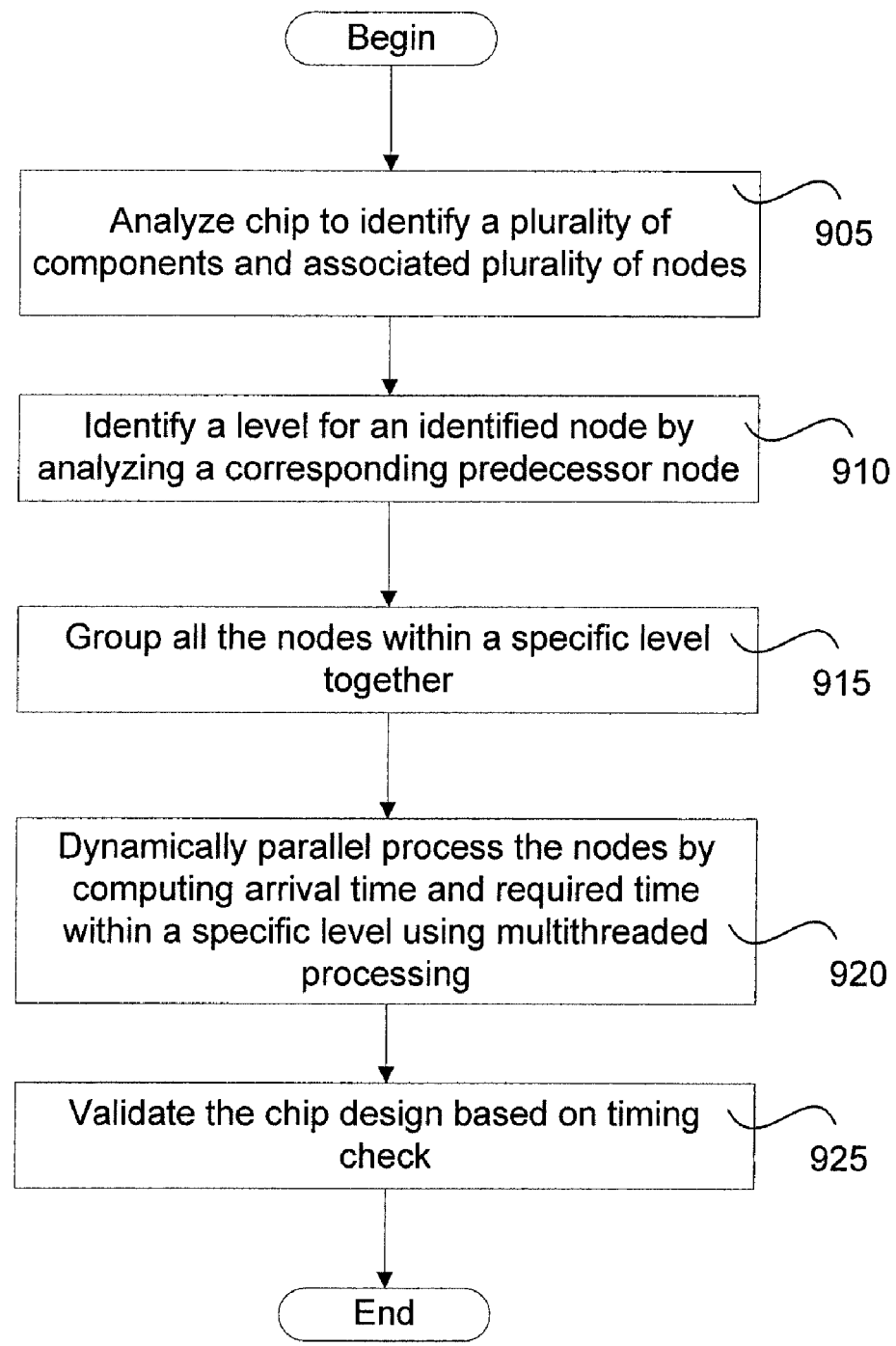
FIG. 9 illustrates a flowchart of operations involved in executing a multithreaded algorithm to perform a static timing analysis, in an alternate embodiment of the invention.

FIG. 9 illustrates the process operation involved in executing multithreaded algorithm for performing a static timing analysis of a chip, in one embodiment of the invention. The multithreaded algorithm is used to analyze a chip design of a chip to identify a plurality of components and the associated nodes and propagation edges, as illustrated in operation 905. The identified nodes are sorted topologically to create a node tree. Each node on the node tree is identified and assigned a level based on an analysis of one or more predecessor nodes associated with the identified node, as illustrated in operation 910. Upon assigning levels to all the nodes, the nodes are all grouped together based on the level associated with each node, as illustrated in operation 915.

A multithreaded algorithm is used to process the nodes in parallel at each level using a plurality of threads. The processing of the nodes includes computing arrival time and required time at each node. As has been previously described, the arrival time at a particular node depends on the arrival time of a predecessor node associated with the particular node and the edge delay associated with one or more inbound edges to the particular node. The parallel processing of nodes results in considerable reduction of time in computing the arrival time for all nodes thereby reducing the overall time used to perform static timing analysis. Upon completion of processing of all the nodes in all the levels using multithreaded processing, a timing check is performed at the end nodes along a timing check edge by comparing the arrival time of a data signal at an end data node against the arrival of a clock signal at an end clock node. If the arrival time of the data signal is less than the arrival time of the clock signal at the clock node, the chip design is deemed acceptable. Prior to performing the timing check, the clock signal at the clock node is adjusted for the clock cycle frequency for the particular chip design. The clock cycle frequency may be preset and obtained automatically from a tcl command file or can be entered by a user through a user interface during the processing of the nodes in a waveform graph. If the arrival time of the data at the data node is greater than the arrival time of the clock signal at the clock node, the chip design is unacceptable as there will be delay in the processing of data due to the delayed arrival of the data signal.

Figure 10:
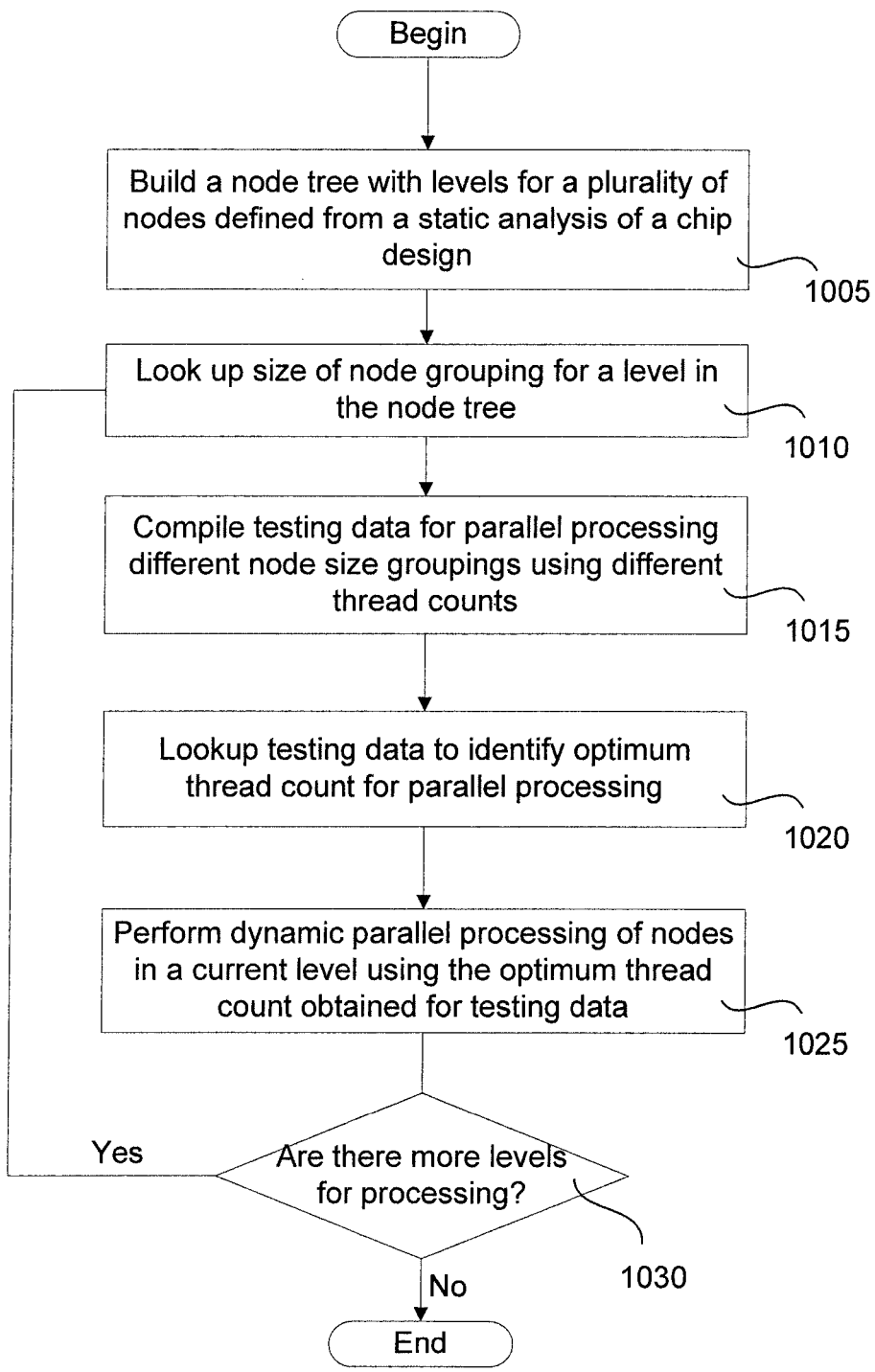
FIG. 10 illustrates flowchart of operations involved in executing a multithreaded algorithm to perform a static timing analysis, in an alternate embodiment of the invention.

FIG. 10 illustrates process operations involved in executing multithreaded algorithm for performing a static timing analysis of a chip, in an alternate embodiment of the invention. The method begins by building a node tree. A multithreaded algorithm builds the node tree by analyzing a chip design (chip circuit) to identify the various components and associated nodes, as illustrated in operation 1005. The node tree includes various levels with a plurality of nodes assigned to appropriate levels. The nodes associated with each level are grouped together. The size of node grouping at a level in the node tree is determined, as illustrated in operation 1010. Testing data is compiled by parallel processing different size of node groupings using varied number of threads, as illustrated in operation 1015. The testing data is then used to identify an optimal thread count for parallel processing nodes in a particular level based on the size of the node grouping for that level, as illustrated in operation 1020. The nodes in the particular level are dynamically processed in parallel using a number of threads defined by the identified optimal thread count, as illustrated in operation 1025.

As mentioned earlier, the processing of each node includes computing arrival time by traversing forward on the waveform graph across various levels of the node tree sequentially, the arrival time computed by taking into consideration the edge delay of the inbound edges and the arrival time of the preceding nodes. Upon completion of processing of all nodes in a particular level, the multithreaded algorithm advances to decision operation 1030 to determine if there are more levels to process. If there are more levels to process then the process returns to operation 1010 where the size of node groupings in a subsequent level are determined in order to dynamically assign number of threads for processing of nodes at the subsequent level. The process continues till there are no more levels to process.

After completion of processing of all nodes at all levels, a timing check is performed at the end nodes along a timing check edge TCE20 by comparing the arrival time of data signal at an end data node against a corresponding arrival time of a clock signal at an end clock node. If the comparison is favorable, the chip design is deemed acceptable. Otherwise, the chip design is tagged unacceptable. In addition to computing the arrival time, the multithreaded algorithm computes required time at each node in each level of the node tree of the waveform graph. The required time is computed by traversing backward on the waveform graph across the various levels of the node tree sequentially. The required time is computed by taking into consideration the edge delay of the outbound edges of the succeeding node(s) and the arrival time at the succeeding nodes. The required time may be used in conjunction with the arrival times to identify the cause of unfavorable result during the timing check.

The assignment of appropriate number of threads may be determined by first analyzing the number of nodes in each group of nodes and determining the number of threads that are available for processing. The number of threads available for processing may depend on the type of processor. For instance a chip multithreading processor may include a 2, 4, 8, 16, 32 or 64 thread parallel processing capability. Based on testing data and analysis of a particular chip design, the optimal number of threads used for parallel processing may be dynamically determined.

Thus, the embodiments of the invention define methods and apparatus for executing a multithreaded algorithm that takes considerably less time to perform a static timing analysis by incorporating parallel processing of nodes at each level.

It will be obvious, however, to one skilled in the art, that the present invention may be practiced without some or all of these specific details. In other instances, well known process operations have not been described in detail in order not to unnecessarily obscure the present invention.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for executing a multithreaded algorithm on a computer system to perform a static timing analysis of a chip, comprising:
    traversing the chip to identify a plurality of components with in a chip circuit of the chip, each of the plurality of components including a plurality of nodes;
    defining a waveform graph for the plurality of nodes;
    assigning a level for groups of one or more nodes from the plurality of nodes to generate a node tree by performing a topological sort of the identified plurality of nodes;
    processing all of the nodes in one level in parallel using two or more threads before processing all of the nodes in a next level; and
    performing a timing check, the timing check determining an acceptable design of the chip.

2. The method for executing a multithreaded algorithm of claim 1, wherein traversing the chip further including traversing a design netlist and parasitic data of the chip to obtain the plurality of nodes and propagation edge for each node for defining a waveform graph.

3. The method for executing a multithreaded algorithm of claim 1, wherein the topological sort including,
    analyzing one or more of the plurality of nodes in a preceding level corresponding to each of the plurality of nodes being assigned; and
    assigning a level for each of the plurality of nodes such that the assigned level is greater than a level of all the nodes in the preceding level.

4. The method for executing a multithreaded algorithm of claim 3, wherein processing all of the nodes further comprising:
    computing an arrival time at each of the plurality of nodes, the arrival time computed by summing the arrival time of the preceding node associated with each of the plurality of nodes and an edge delay between the associated preceding node and each of the plurality of nodes.

5. The method for executing a multithreaded algorithm of claim 4, wherein the processing all of the nodes in one level further comprising:
    determining the number of nodes available for processing at the one level;
    dynamically identifying a limited number of threads from the available number of threads for processing each of the nodes at the one level based on the number of nodes at the level, the limited number of threads providing an optimal multithreaded processing; and
    assigning one or more nodes to a thread from the limited number of threads for processing.

6. The method for executing a multithreaded algorithm of claim 5, wherein the processing all of the nodes in one level further comprising:
    determining the number of threads available for processing;
    dynamically partitioning the groups of nodes in the one level of the waveform graph into a plurality of subgroups of nodes such that the number of subgroups of nodes is equal to the available number of threads; and
    assigning each of the plurality of subgroups of nodes to an available thread for processing.

7. The method for executing a multithreaded algorithm of claim 6, wherein performing a timing check further comprising:
    comparing arrival time at a data node with that of a clock node, the arrival time at the clock node adjusted for a processor clock frequency, wherein the processor clock frequency is obtained as a constraint.

8. The method for executing a multithreaded algorithm of claim 7, wherein processing all of the nodes further comprising:
    computing a required time at each of the plurality of nodes, the required time computed by propagating backwards on the waveform graph, the required time computed by reducing an outgoing edge delay of a succeeding node from the arrival time at a succeeding node associated with each of the plurality of nodes, the required time used in further analysis of static timing analysis.

9. The method for executing a multithreaded algorithm of claim 1, further including providing system resources configured to perform multithreaded operations, the system resources including one or more of system libraries and memory allocator.

10. An apparatus for executing a multithreaded algorithm to perform a static timing analysis of a chip, comprising:
    a chip multithreading processor; and
    a multithreading algorithm engine having a multithreaded algorithm, the multithreaded algorithm configured to,
        analyze the chip to identify a plurality of nodes with in a chip circuit of the chip;
        define a waveform graph from the plurality of nodes;
        assign a level for groups of one or more nodes from the plurality of nodes to generate a node tree by performing a topological sort of the identified plurality of nodes;
        process all of the nodes in one level in parallel using two or more threads before processing all of nodes in a next level; and
        perform a timing check, the timing check determining an acceptable design of the chip.

11. The apparatus for executing a multithreaded algorithm of claim 10, further including system resources configured to perform multithreaded operations, the system resources including one or more of system libraries and memory allocator.

12. The apparatus for executing a multithreaded algorithm of claim 10, further comprising a tool command language file to provide constraints for processing all of the nodes and for performing the timing check.

13. The apparatus for executing a multithreaded algorithm of claim 10, further including a design netlist and parasitic data module to identify the plurality of nodes and propagation edge for each node for defining a waveform graph.

14. The apparatus for executing a multithreaded algorithm of claim 10, further including a report repository for storing static timing analysis reports created during static timing analysis.

* * * * *